(12) United States Patent
Kodama

(10) Patent No.: US 11,923,222 B2
(45) Date of Patent: Mar. 5, 2024

(54) SUBSTRATE TRANSFER DEVICE AND SUBSTRATE GRIPPING DETERMINATION METHOD

(71) Applicant: Tokyo Electron Limited, Tokyo (JP)

(72) Inventor: Toshiaki Kodama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 336 days.

(21) Appl. No.: 17/325,704

(22) Filed: May 20, 2021

(65) Prior Publication Data

US 2021/0366747 A1   Nov. 25, 2021

(30) Foreign Application Priority Data

May 22, 2020 (JP) .................................. 2020-089832

(51) Int. Cl.
| | | |
|---|---|---|
| *H01L 21/67* | (2006.01) | |
| *B25J 9/04* | (2006.01) | |
| *B25J 9/16* | (2006.01) | |
| *B25J 13/08* | (2006.01) | |
| *B25J 15/00* | (2006.01) | |
| *H01L 21/687* | (2006.01) | |

(52) U.S. Cl.
CPC ...... *H01L 21/67259* (2013.01); *B25J 9/1612* (2013.01); *B25J 9/163* (2013.01); *B25J 9/1674* (2013.01); *B25J 13/082* (2013.01); *B25J 15/0014* (2013.01); *H01L 21/68707* (2013.01); *B25J 9/042* (2013.01)

(58) Field of Classification Search
CPC ......... H01L 21/67259; H01L 21/68707; H01L 21/67253; H01L 21/67766; H01L 21/67742; B25J 9/1612; B25J 9/163; B25J 9/1674; B25J 13/082; B25J 15/0014; B25J 9/042; B25J 9/1679; B25J 9/06; B25J 11/0095; B25J 15/0206
See application file for complete search history.

(56) References Cited

U.S. PATENT DOCUMENTS

| | | | |
|---|---|---|---|
| 2009/0093906 A1* | 4/2009 | Takizawa | H01L 21/68707 700/214 |
| 2019/0214289 A1* | 7/2019 | Dogome | H01L 21/67265 |

FOREIGN PATENT DOCUMENTS

| | | | |
|---|---|---|---|
| JP | H05-082019 A | | 4/1993 |
| JP | 2006237407 A | * | 9/2006 |
| JP | 2012059951 A | * | 3/2012 |

* cited by examiner

*Primary Examiner* — Adam R Mott
*Assistant Examiner* — Alyzia N Dilworth
(74) *Attorney, Agent, or Firm* — Armstrong Teasdale LLP

(57) ABSTRACT

A substrate transfer device includes: a support part configured to support a substrate to be transferred and provided with a plurality of engagement portions which are engaged with an edge of the substrate on a first side of the substrate; a gripping part configured to move toward or away from the plurality of engagement portions and provided with a plurality of contact portions which come into contact with the edge of the substrate on a second side of the substrate when moving toward the plurality of engagement portions; a plurality of detection parts provided in the plurality of contact portions, respectively, and configured to detect distortion amounts of the plurality of contact portions; and a determination part configured to determine a gripping situation of the substrate based on detection results obtained by the plurality of detection parts.

7 Claims, 6 Drawing Sheets

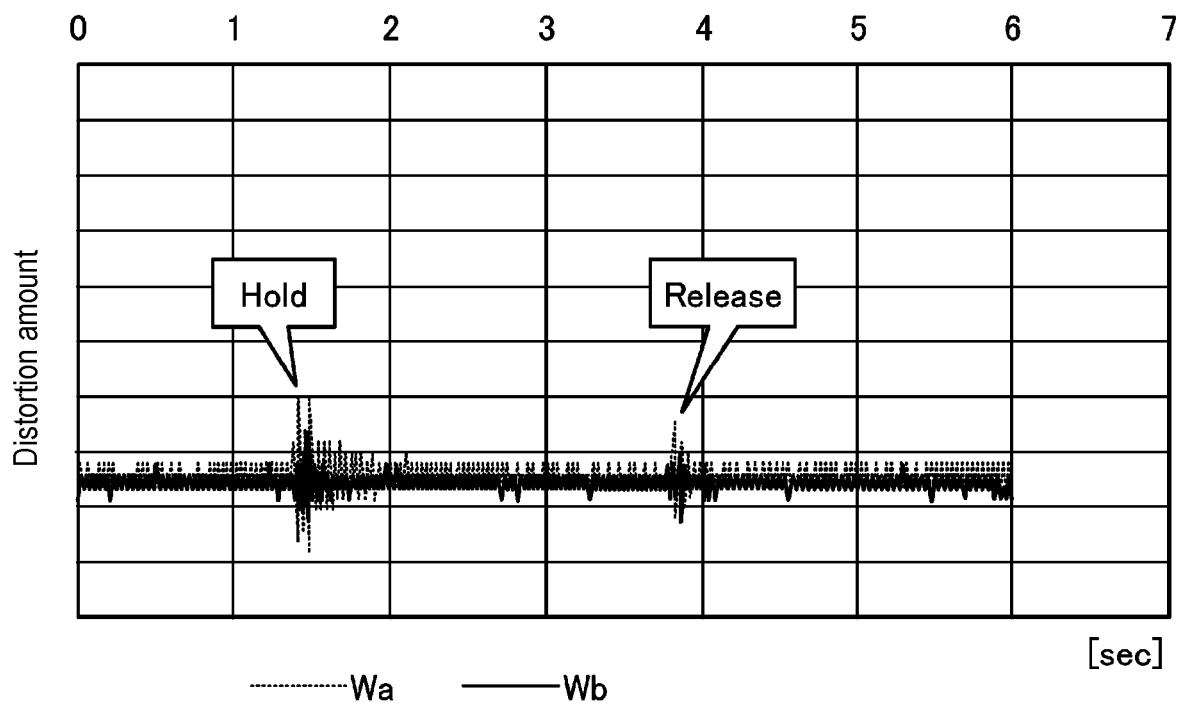
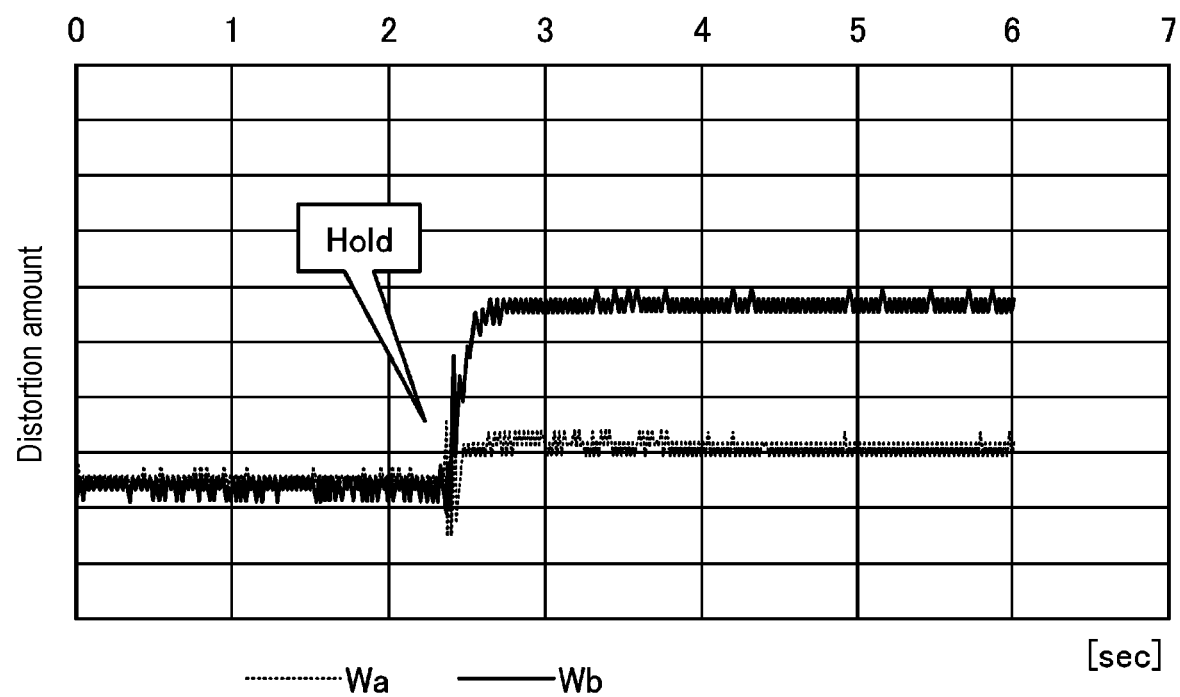

SUBSTRATE TRANSFER DEVICE AND SUBSTRATE GRIPPING DETERMINATION METHOD

CROSS-REFERENCE TO RELATED APPLICATION

This application is based upon and claims the benefit of priority from Japanese Patent Application No. 2020-089832, filed on May 22, 2020, the entire contents of which are incorporated herein by reference.

TECHNICAL FIELD

The present disclosure relates to a substrate transfer device and a substrate gripping determination method.

BACKGROUND

Patent Document 1 discloses a technique for quickly and accurately detecting the occurrence of a chucking error by detecting that a drive device outputs a predetermined article gripping torque, and detecting that a chuck reaches a predetermined article gripping position.

PRIOR ART DOCUMENT

Patent Document

Patent Document 1: Japanese Laid-Open Patent Publication No. H05-082019

SUMMARY

According to one embodiment of the present disclosure, there is provided a substrate transfer device that includes: a support part configured to support a substrate to be transferred and provided with a plurality of engagement portions which are engaged with an edge of the substrate on a first side of the substrate; a gripping part configured to move toward or away from the plurality of engagement portions and provided with a plurality of contact portions which come into contact with the edge of the substrate on a second side of the substrate when moving toward the plurality of engagement portions; a plurality of detection parts provided in the plurality of contact portions, respectively, and configured to detect distortion amounts of the plurality of contact portions; and a determination part configured to determine a gripping situation of the substrate based on detection results obtained by the plurality of detection parts.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a diagram showing an example of waveforms of distortion amounts when the wafer is not gripped.

FIG. 8 is a diagram showing an example of a waveforms of distortion amounts when the defective gripping of the wafer is generated.

DETAILED DESCRIPTION

Hereinafter, embodiments of a substrate transfer device and a substrate gripping determination method disclosed herein will be described in detail with reference to the drawings. The substrate transfer device and the substrate gripping determination method disclosed herein are not limited by the embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A substrate transfer device, such as a transfer arm for transferring a substrate, such as a semiconductor wafer (hereinafter, referred to as "wafer"), are known. The substrate transfer devices may include a gripping mechanism configured to grip the substrate by clamping the edge of the substrate at a plurality of locations in two opposite directions in order to stably transfer the substrate. For example, the substrate transfer device has a Y-shaped fork formed by bifurcating the tip end of the transfer arm. Each of the two branched tip ends of the fork has an engagement portion to be engaged with the edge of the substrate. The substrate transfer device grips the edge of the substrate by bringing the edge of the substrate into engagement with the two engagement portions on one side of the substrate and pressing the edge at a plurality of locations on the other side of the substrate.

However, in the substrate transfer device, a defective transfer, such as substrate dropping due to defective gripping of the substrate, may occur. Therefore, a technique for detecting the defective gripping of the substrate is needed.

Embodiments

Figure 1:
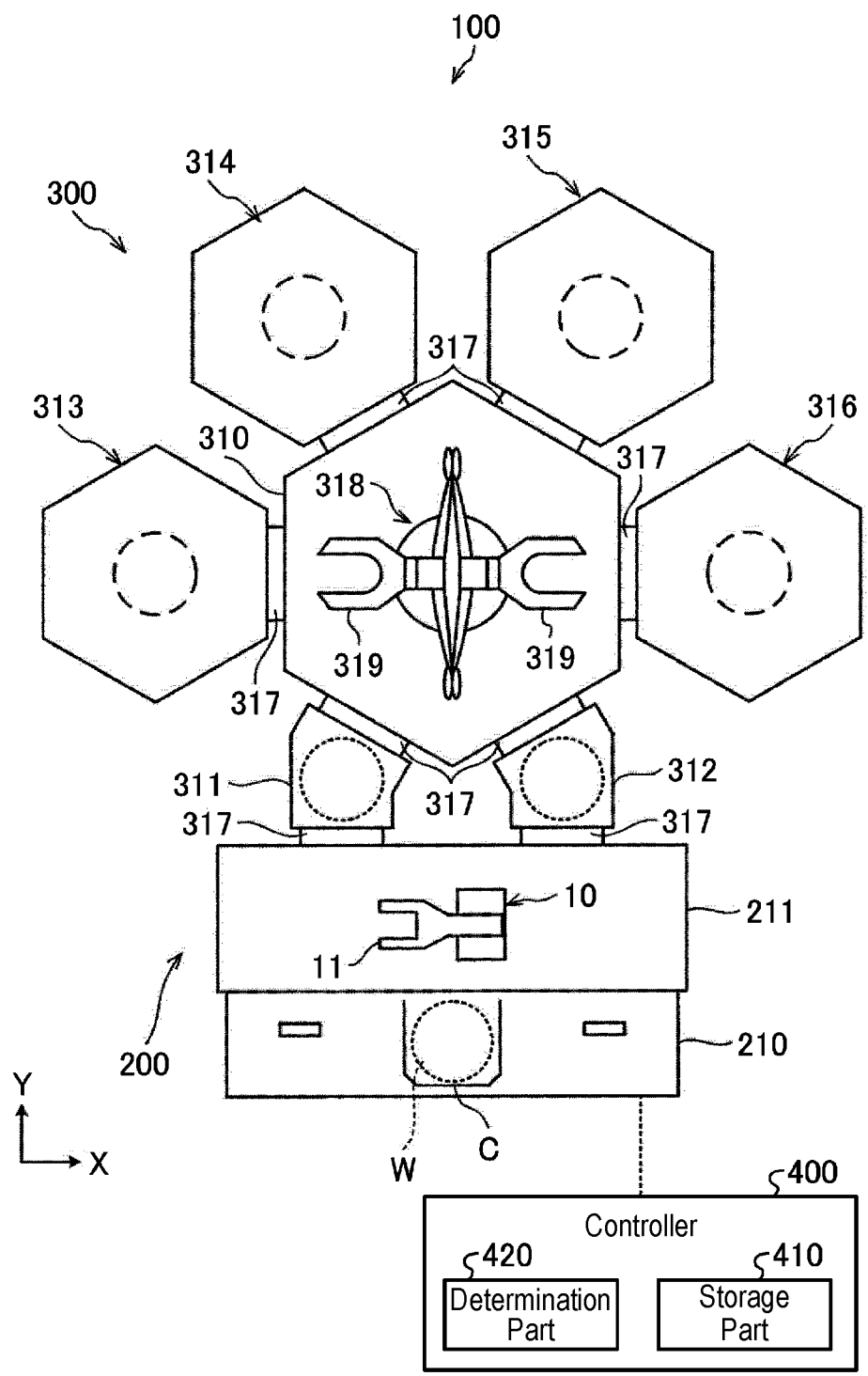
FIG. 1 is a plan view illustrating a schematic configuration of a substrate processing system according to an embodiment.

Next, embodiments will be described. First, a configuration of a substrate processing system according to the present embodiment will be described. FIG. 1 is a plan view illustrating a schematic configuration of a substrate processing system 100 according to the embodiment.

As illustrated in FIG. 1, the substrate processing system 100 has a configuration in which a cassette station 200 to and from which wafers W as substrates are loaded and unloaded on a unit of cassettes, and a processing station 300 provided with a plurality of processing apparatuses configured to process the wafers W in a single-wafer manner, which are integrally connected to each other, are provided.

The cassette station 200 includes a cassette stage 210 and a transfer chamber 211. In the cassette stage 210, a plurality of (e.g., three) cassettes C each capable of accommodating the plurality of wafers W may be placed side by side in an X-axis direction (the left-right direction in FIG. 1). The transfer chamber 211 is located adjacent to the cassette stage 210 in a positive side Y-axis direction (upward direction in FIG. 1). The transfer chamber 211 is provided with a wafer transfer device 10 configured to transfer the wafer W. In the present embodiment, the wafer transfer device 10 corresponds to the substrate transfer device of the present disclosure. The wafer transfer device 10 in the transfer chamber 211 includes a swingable and extendible articulated transfer arm 11, and is capable of transferring the wafer W with respect to the cassette C of the cassette stage 210 and load lock chambers 311 and 312 of the processing station 300 to be described later. An operation of the wafer transfer device 10 is controlled by a controller 400 to be described later.

A main transfer chamber 310 whose interior can be depressurized is provided in the central portion of the processing station 300. The main transfer chamber 310 is formed in, for example, a substantially hexagonal shape in a plan view. The load lock chamber 311 and 312 and, for example, four processing apparatuses 313, 314, 315, and 316, are connected to the main transfer chamber 310 so as to surround the main transfer chamber 310.

The load lock chambers 311 and 312 are arranged between the main transfer chamber 310 and the transfer chamber 211 of the cassette station 200, and connect the main transfer chamber 310 and the transfer chamber 211. Each of the load lock chambers 311 and 312 includes a stage (not illustrated) for the wafer W. The interior of each of the load lock chambers 311 and 312 can be kept in a depressurized atmosphere.

Between the transfer chamber 211 and each of the load lock chambers 311 and 312, between the main transfer chamber 310 and each of the load lock chambers 311 and 312, and between the main transfer chamber 310 and each of the processing apparatuses 313 to 316, gate valves 317 configured to hermetically seal between the respective parts and communicate the respective parts with each other, respectively, are provided.

A vacuum wafer transfer device 318 is provided in the main transfer chamber 310. The vacuum wafer transfer device 318 includes, for example, two transfer arms 319. Each of the transfer arms 319 is configured to be swingable and extendible so as to transfer the wafer W to the load lock chambers 311 and 312 and the processing apparatuses 313 to 316 arranged around the main transfer chamber 310. The transfer of the wafer W by the vacuum wafer transfer device 318 is controlled by the controller 400 to be described later.

The processing apparatuses 313 to 316 are plasma processing apparatuses configured to perform predetermined processing, for example, plasma processing, based on a predetermined processing recipe. The processing of the wafer W in the processing apparatuses 313 to 316 is controlled by the controller 400 to be described later.

In addition, the substrate processing system 100 includes a controller 400 configured to control the wafer transfer device 10, the vacuum wafer transfer device 318, the processing apparatuses 313 to 316, and the like. The controller 400 is, for example, a computer, and controls each part of the substrate processing system 100. The controller 400 includes a program storage part 410. The storage part 410 stores various programs and various data for controlling the operation and the like of the wafer transfer device 10. The programs and the data may be stored in a non-transitory computer-readable storage medium (e.g., a hard disc, an optical disc such as a DVD, a flexible disc, a semiconductor memory, or the like). In addition, the programs and the data may be stored in another device, and may be read and used online, for example, via a dedicated line.

The controller 400 functions as various processing parts by executing various programs. For example, the controller 400 has a function of a determination part 420 to be described later. In the present embodiment, the case where the controller 400 functions as various processing parts will be described by way of example, but the present disclosure is not limited thereto. For example, various processing parts may be separately implemented by a plurality of controllers. For example, the function of the determination part 420 may be dispersedly implemented by the plurality of controllers. In addition, the wafer transfer device 10 may include a controller, and the controller may have the function of the determination part 420.

Figure 2:
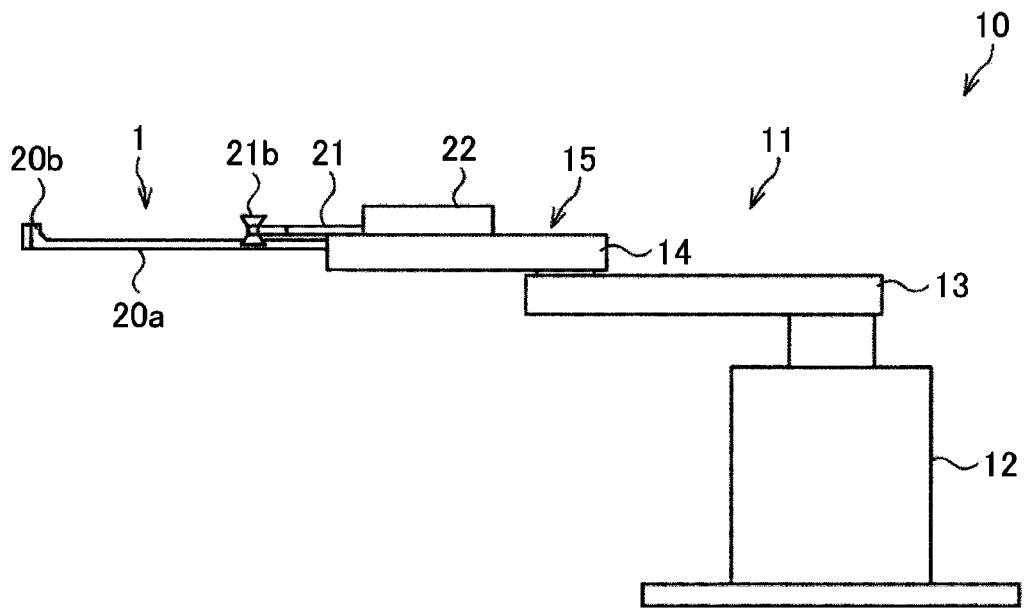
FIG. 2 is a side view illustrating a schematic configuration of a wafer transfer device according to an embodiment.

Next, a configuration of the wafer transfer device 10 will be described. FIG. 2 is a side view illustrating a schematic configuration of the wafer transfer device 10 according to an embodiment. As illustrated in FIG. 2, the wafer transfer device 10 has a base 12 and a transfer arm 11. The base 12 is configured to be moved in the horizontal direction and to be raised and lowered by a drive part (not illustrated).

The transfer arm 11 is configured to be swingable and extendible, and includes a first arm 13 and a second arm 14. A base end side of the first arm 13 is connected to the base 12 to be rotatable around a vertical axis. The second arm 14 has a mounting portion 15 provided at a base end side thereof. The mounting portion 15 is connected to the tip end of the first arm 13 to be rotatable around a vertical axis, and mounts various kinds of components thereon. In addition, the second arm 14 includes a wafer gripping mechanism 1 as a substrate gripping mechanism, which grips the wafer W while the wafer W is being transferred.

Figure 3:
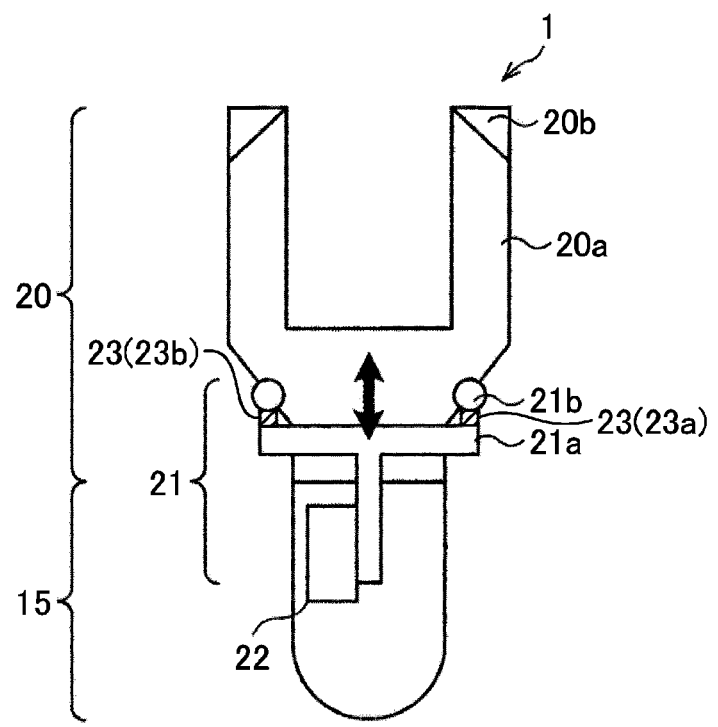
FIG. 3 is a plan view illustrating a schematic configuration of a wafer gripping mechanism according to an embodiment.

FIG. 3 is a plan view illustrating a schematic configuration of the wafer gripping mechanism 1 according to an embodiment. As illustrated in FIG. 3, the wafer gripping mechanism 1 includes a fork 20, a pusher 21, and an actuator 22. Of these, the actuator 22 is mounted on the mounting portion 15 described above. A component mounting space in the mounting portion 15 is covered with a housing (not illustrated). This makes it possible to prevent particles from affecting the wafer W, even if the particles are generated from the components mounted on the mounting portion 15.

The fork 20 includes a fork body 20a extending from the mounting portion 15 and having bifurcated tip ends formed in a Y shape. Fixed clamp portions 20b are formed at the bifurcated tip ends of the fork body 20a, respectively. The fixed clamp portions 20b protrude upward from the top surface of the fork 20 to be engaged with the edge of the wafer W. The wafer W placed on the fork 20 is fixed by bring the edge on the tip end side of the fork 20 into contact with the fixed clamp portions 20b.

The pusher 21 has a pusher body 21a, the tip end side of which is formed in a bifurcated shape. A movable clamp portion 21b is provided at each of the bifurcated tip ends of the pusher body 21a. The pusher 21 according to the present embodiment is provided with two movable clamp portions 21b at the respective tip ends thereof, and comes into contact with the edge of the wafer W by the two movable clamp portions 21b. A sensor 23 (23a and 23b) configured to detect distortion is provided in each of the two movable clamp portions 21b. For example, the sensor 23 is provided at a connection portion between the movable clamp portions 21b and the pusher 21. The base end side of the pusher body 21a is connected to the actuator 22.

The actuator 22 is a drive part configured to move the pusher body 21a, that is, the movable clamp portions 21b, toward or away from the fixed clamp portions 20b, and is constituted with, for example, an air cylinder. The actuator 22 may be constituted with a linear motor or a linear solenoid.

The wafer gripping mechanism 1 is capable of gripping the wafer W between the fixed clamp portions 20b and the movable clamp portions 21b configured to move toward or away from the fixed clamp portions 20b by the actuator 22.

The wafer W is placed on the fork 20 such that the edge of the wafer W on the tip end side of the fork 20 comes into contact with the fixed clamp portions 20b. When gripping the wafer W, in the wafer gripping mechanism 1, the actuator 22 is driven under the control of the controller 400, and thus the movable clamp portions 21b of the pusher 21 move toward the fixed clamp portions 20b. Then, the movable clamp portions 21b come into contact with and press the edge of the wafer W on the distal end side of the fork 20, whereby the wafer W is gripped (held). For example, setting information related to the operation of the actuator 22 is stored in the storage part 410 such that a gripping force for gripping the wafer W by the wafer gripping mechanism 1 falls within an appropriate range in the initial setting of the wafer gripping mechanism 1. The controller 400 drives the actuator 22 according to the setting information so that the wafer W is gripped by virtue of an appropriate gripping force.

Figure 4:
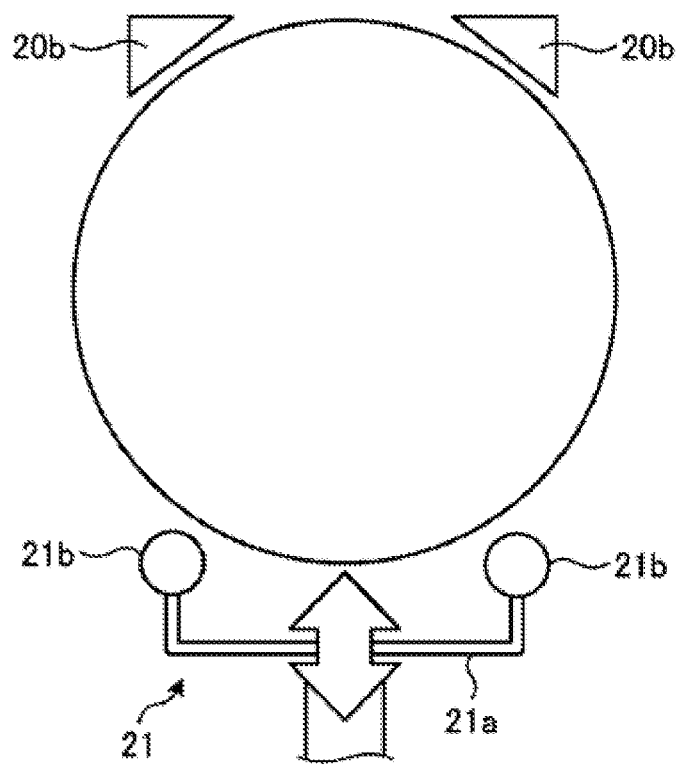
FIG. 4 is a view illustrating an example in which defective gripping of a wafer is detected in the related art.

Here, it is conceivable to detect the defective gripping of the wafer W using the technique disclosed in Patent Document 1. For example, it is conceivable to detect the defective gripping by detecting that the actuator 22 outputs a predetermined article gripping torque and detecting that the pusher 21 reaches a predetermined article gripping position. FIG. 4 is a view illustrating an example in which the defective gripping of the wafer W is detected in the related art. For example, the controller 400 obtains an amount of movement of the pusher 21 toward the fixed clamp portions 20b based on the position information of the pusher 21, and determines whether or not the wafer W can be gripped normally based on the amount of movement.

However, in the case of determining whether or not the wafer W can be gripped normally based on the amount of movement, the defective gripping of the wafer W may not be detected. For example, when the wafer W gets on one of the two fixed clamp portions 20b, the respective fixed clamp portion 20b may not be engaged with the edge of the wafer W. In such a case, since the other fixed clamp portion 20b is engaged with the edge of the wafer W, the wafer W may be unstably gripped by the wafer gripping mechanism 1. A defective transfer in which the wafer W is dropped in the course of transferring the wafer W may occur.

Figure 5:
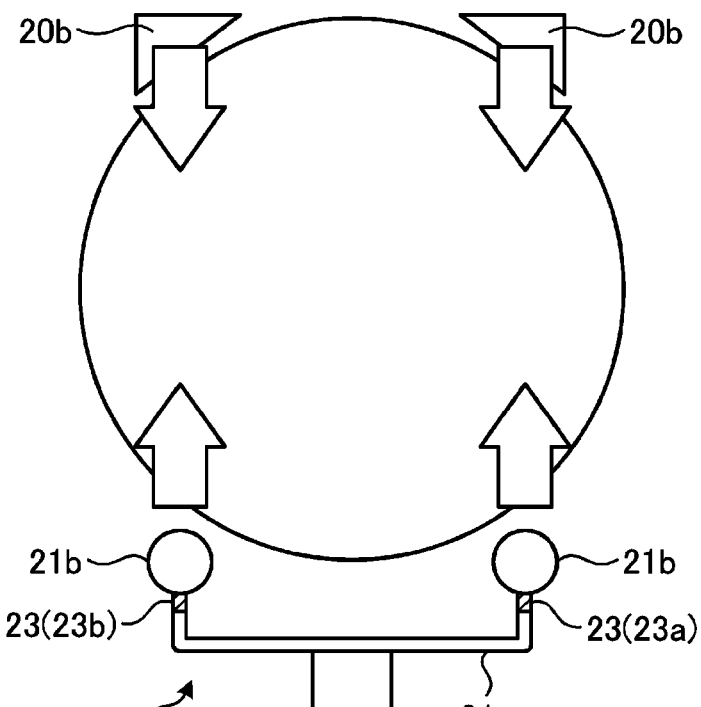
FIG. 5 is a view illustrating a force generated when gripping the wafer.

The wafer gripping mechanism 1 according to the present embodiment presses and grips the edge of the wafer W using the two movable clamp portions 21b. FIG. 5 is a view illustrating a force generated when gripping the wafer W. When each of the two fixed clamp portions 20b is engaged with the edge of the wafer W, a repulsion force caused when pressing the wafer W is generated substantially equally at each of the fixed clamp portions 20b and the movable clamp portions 21b. Meanwhile, for example, when one of the two fixed clamp portions 20b is not engaged with the edge of the wafer W, deviation in distortion between the two movable clamp portions 21b is generated.

Therefore, the wafer transfer device 10 according to the present embodiment detects the distortions of the movable clamp portions 21b using the respective sensors 23 when gripping the wafer W. The sensors 23 output detected distortion data to the controller 400. The determination part 420 of the controller 400 determines the gripping state of the wafer W based on the result detected by each sensor 23. For example, the determination part 420 determines the gripping state of the wafer W based on a waveform of a distortion amount detected by each sensor 23.

Figure 6:
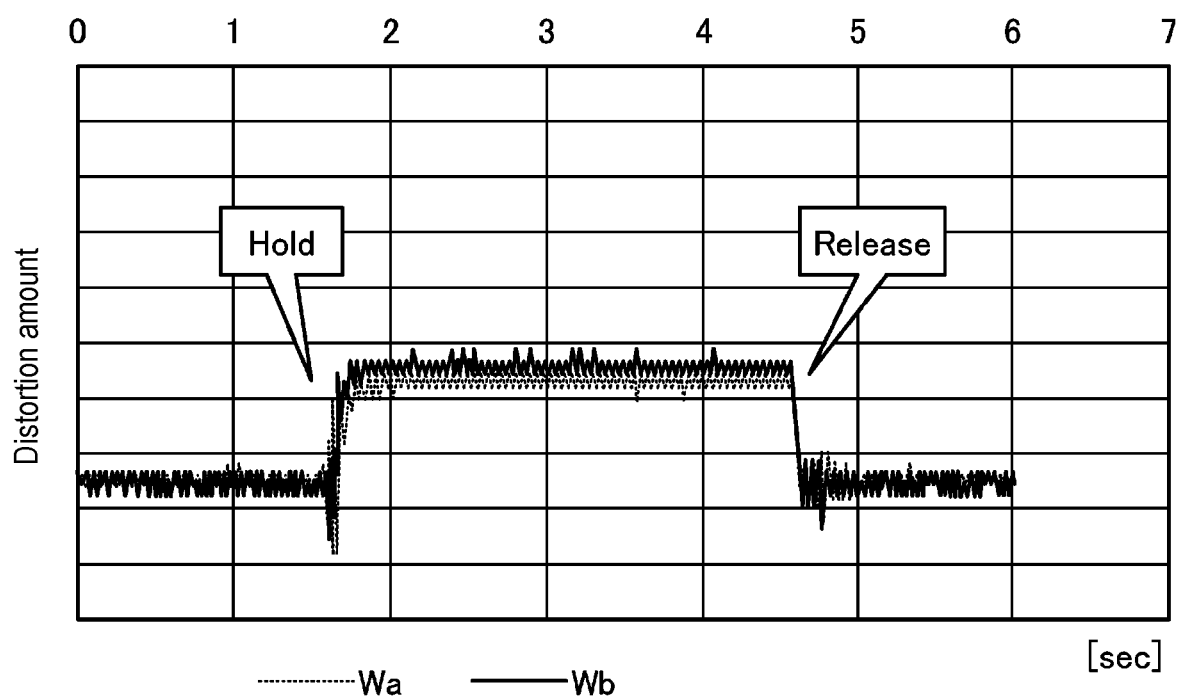
FIG. 6 is a diagram showing an example of waveforms of distortion amounts when the wafer is gripped normally.

FIG. 6 is a diagram showing an example of waveforms of distortion amounts available when the wafer W is gripped normally. FIG. 6 shows waveforms available when the two fixed clamp portions 20b are engaged with the edge of the wafer W, and thus the wafer W is gripped normally. In FIG. 6, there are shown waveforms Wa and Wb of the distortion amounts detected by the sensors 23a and 23b. In FIG. 6, a timing at which the pusher 21 is moved forward and the movable clamp portions 21b come into contact with the edge of the wafer W is indicated as "Hold", and a timing at which the pusher 21 is moved backward and the movable clamp portions 21b are spaced apart from the edge of the wafer W is indicated as "Release". The distortion amounts detected by the sensors 23a and 23b increase when the movable clamp portions 21b come into contact with the edge of the wafer W and begin to grip the wafer W, and decrease when the movable clamp portions 21b are spaced apart from the edge of the wafer W to release the gripping. When the wafer W is gripped normally, the distortions amount detected by the sensors 23a and 23b change in the similar manner so that the waveforms Wa and Wb have similar shapes.

FIG. 7 is a diagram showing an example of waveforms of distortion amounts available when the wafer W is not gripped. FIG. 7 shows waveforms available when the two fixed clamp portions 20b are not engaged with the edge of the wafer W and thus the wafer W is not gripped. In FIG. 7, there are shown waveforms Wa and Wb of the distortion amounts detected by the sensors 23a and 23b. In FIG. 7, timings of "Hold" and "Release" similar to those in FIG. 6 are indicated. When the wafer W is not gripped, the distortion amounts detected by the sensors 23a and 23b do not increase significantly, and vibrate at the timings of "Hold" and "Release". Even when the wafer W is not gripped, the distortion amounts detected by the sensors 23a and 23b change in the similar manner so that the waveforms Wa and Wb have similar shapes.

FIG. 8 is a diagram showing an example of waveforms of distortion amounts available when the defective gripping of the wafer W occurs. FIG. 8 shows waveforms in a case in which one of the two fixed clamp portions 20b is engaged with the edge of the wafer W, whereas the other fixed clamp portion 20b is not engaged with the edge of the wafer W, and thus the defective gripping of the wafer W occurs. In FIG. 8, there are shown waveforms Wa and Wb of the distortion amounts detected by the sensors 23a and 23b. In FIG. 8, a timing at which the pusher 21 is moved forward and thus the movable clamp portions 21b come into contact with the edge of the wafer W is indicated as "Hold". When one of the two fixed clamp portions 20b is not engaged with the edge of the wafer W as described above, deviation occurs in the distortion amounts detected by the sensors 23a and 23b.

The determination part 420 determines the gripping state of the wafer W based on the waveforms of the distortion amounts detected by each sensor 23. First, the determination part 420 determines whether or not the gripping of the wafer W has been initiated from the distortion amounts detected by each sensor 23. When the movable clamp portions 21b come into contact with and press the edge of the wafer W, the distortion amounts detected by the sensor 23 increase. Therefore, based on the distortion amounts, the determination part 420 can determine whether or not the movable clamp portions 21b come into contact with the edge of the wafer W and the gripping of the wafer W is initiated. For example, the determination part 420 determines whether the distortion mount detected by any of the sensors 23 is equal to or greater than a first threshold. The first threshold is a distortion amount that can be regarded that the gripping of the wafer W has been initiated. For example, the first threshold may be a distortion amount of a predetermined percentage (e.g., 30% to 60%) of the distortion amount generated when the wafer W is gripped normally.

When determining that the gripping of the wafer W has been initiated, the determination part 420 determines whether or not the defective gripping of the wafer W has occurred based on the difference between the distortion amounts detected by respective sensors 23. For example, when the distortion amount detected by any of the sensors 23 is equal to or greater than the first threshold, the determination part 420 determines whether or not the difference between the distortion amounts detected by respective sensors 23 is equal to or greater than a second threshold. The second threshold is a value that can be regarded that the defective gripping of the wafer W has occurred. For example, the second threshold may be a value of a predetermined percentage (e.g., 30% to 60%) of the difference in the distortion amounts available when the defective gripping of the wafer W has occurred in the state in which one of the fixed clamp portions 20b is not engaged with the edge of the wafer W. When the difference in the distortion amounts is equal to or greater than the second threshold, the determination part 420 determines that the defective gripping has occurred. Meanwhile, when the difference in the distortion amounts is less than the second threshold, the determination part 420 determines that the wafer W is gripped normally.

When the second threshold is sufficiently greater than noise of the distortion amount detected by each sensor 23 in the state in which the wafer W is not being gripped, the determination part 420 may determine the occurrence of the defective gripping only based on whether or not the difference in the distortion amounts detected by the sensors 23 is equal to or greater than the second threshold.

When it is determined by the determination part 420 that the defective gripping of the wafer W has occurred, the controller 400 notifies the operator of the substrate processing system 100 of information indicating that the defective gripping of the wafer W has occurred. For example, the controller 400 controls a display part (not illustrated) to display an error message thereon.

As described above, in the wafer transfer device 10 including the wafer gripping mechanism 1, the controller 400 is capable of determining the gripping state of the wafer W based on the detection result obtained by each of the plurality of sensors 23.

In the wafer transfer device 10, a transfer abnormality that the wafer W is brought into contact with another member such as the inner wall of the transfer chamber 211 or the cassette C during the transfer of the wafer W, may occur. When the wafer W gripped by the wafer gripping mechanism 1 is brought into contact with another member, the wafer transfer device 10 vibrates.

The determination part 420 may determine whether or not the transfer abnormality of the wafer W has occurred based on the distortion amount detected by each sensor 23. For example, waveform data of a distortion amount when the wafer W is transferred normally is stored in the storage part 410. The determination part 420 compares the waveform of the distortion amount detected by each sensor 23 with a waveform of the waveform data stored in the storage part 410, and determines whether or not the transfer abnormality of the wafer W has occurred. For example, the determination part 420 compares the distortion amount detected by each sensor 23 at the time at which the transfer arm 11 performs the same operation with the waveform of the waveform data stored in the storage part 410. When an amplitude of the waveform of the distortion amount detected by each sensor 23 is greater than that of the waveform of the waveform data by a predetermined allowable value or more, the determination part 420 determines that the transfer abnormality of the wafer W has occurred.

When it is determined by the determination part 420 that the transfer abnormality has occurred, the controller 400 notifies the operator of the substrate processing system 100 of information indicating that the transfer abnormality of the wafer W has occurred. For example, the controller 400 controls a display part (not illustrated) to display an error message.

In the substrate processing system 100, a device that generates vibration, such as a pump, may be arranged near the wafer transfer device 10. In the device that generates vibration, the vibration may increase due to deterioration of the device.

The determination part 420 may detect deterioration of surrounding devices based on a change in the distortion amount detected by the sensor 23 in a state in which the operation of the wafer transfer device 10 is stopped. For example, in the state in which the apparatus has not been deteriorated, such as a timing at which the substrate processing system 100 is installed or a timing at which maintenance has been conducted on the substrate processing system 100, the waveform of the distortion amount detected by each sensor 23 while the operation of the wafer transfer device 10 is stopped is stored in the storage part 410 as waveform data before deterioration. The determination part 420 determines whether the transfer abnormality has occurred by comparing the waveform of the distortion amount detected by each sensor 23 while the operation of the wafer transfer device 10 is stopped with a waveform of the waveform data before deterioration stored in the storage part 410. For example, the determination part 420 periodically compares the distortion amount detected by each sensor 23 with the waveform of the waveform data before deterioration stored in the storage part 410 while the operation of the wafer transfer device 10 is stopped. When an amplitude of the waveform of the distortion amount detected by each sensor 23 is larger than that of the waveform of the waveform data before deterioration by a predetermined allowable value or more, the determination part 420 determines that surrounding devices have deteriorated.

When it is determined by the determination part 420 that the surrounding devices have deteriorated, the controller 400 notifies the operator of the substrate processing system 100 of information indicating that the surrounding devices have deteriorated. For example, the controller 400 controls a display part (not illustrated) to display an error message thereon.

Next, an example of the wafer transfer process performed by the wafer transfer device 10 in the substrate processing system 100 will be described.

The wafer W to be transferred is placed on the fork 20. In this step, the wafer gripping mechanism 1 remains opened. For example, the wafer transfer device 10 operates the transfer arm 11 such that the fork 20 is located below the wafer W to be transferred. Then, the wafer transfer device 10 operates the transfer arm 11 such that the fork 20 is raised. As a result, the wafer W to be transferred is placed on the fork 20.

The wafer transfer device 10 grips the wafer W using the wafer gripping mechanism 1. For example, the controller 400 drives the actuator 22 to move the movable clamp portions 21b of the pusher 21 toward the fixed clamp portions 20b, and the wafer W is gripped by the fixed clamp portions 20b and the movable clamp portions 21b. Each of the sensors 23 provided in the movable clamp portions 21b detects distortion and outputs data of the detected distortion to the controller 400.

The determination part 420 of the controller 400 determines the gripping state of the wafer W based on the result detected by each sensor 23.

[Substrate Gripping Determination Method]

Figure 9:
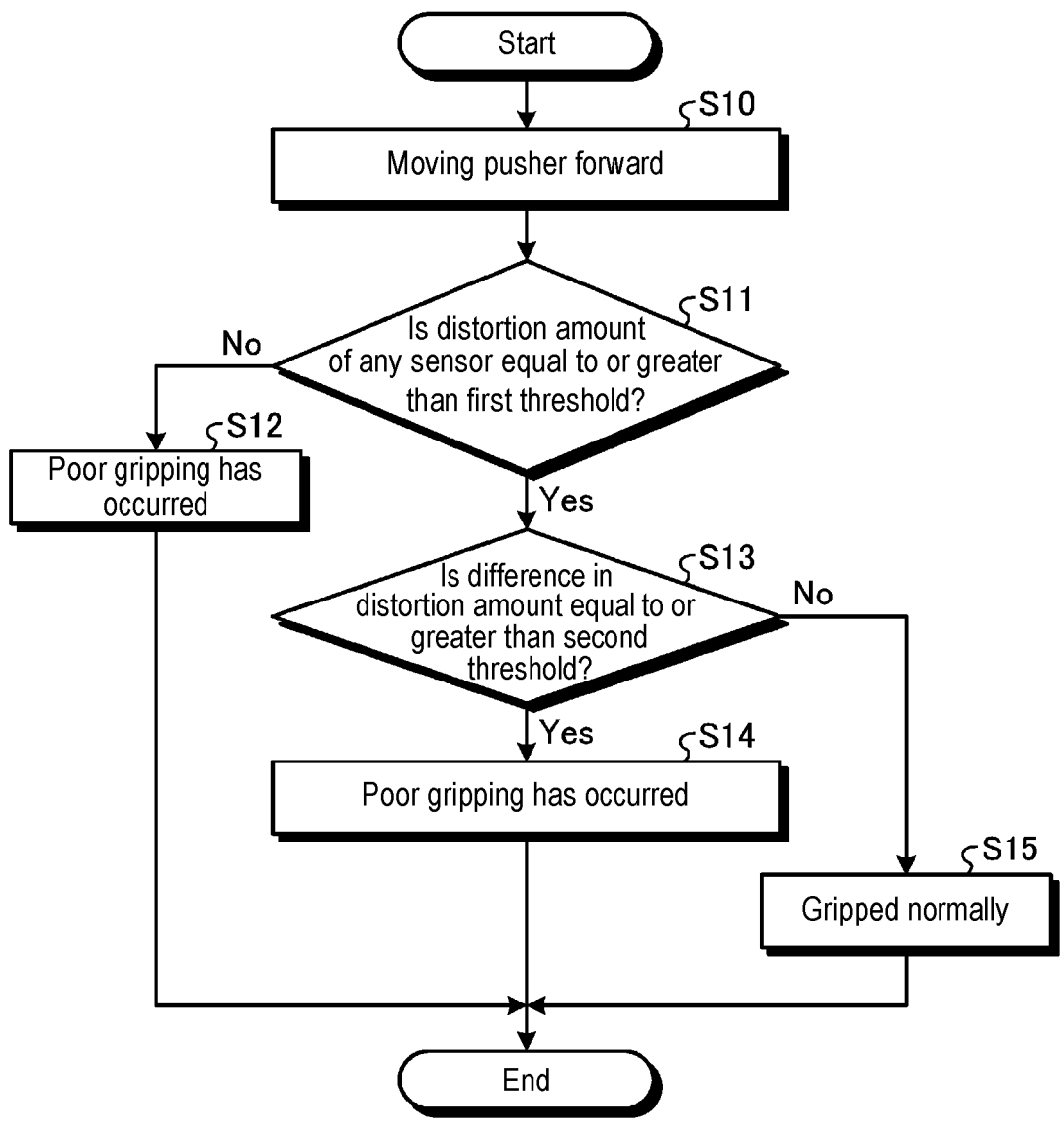
FIG. 9 is a diagram illustrating an example of a control flow of a substrate gripping determination method according to an embodiment.

An example of a control flow of a substrate gripping determination method in which the controller 400 determines a gripping state of a substrate will be described. FIG. 9 is a diagram illustrating an example of the control flow of the substrate gripping determination method according to an embodiment.

The controller 400 drives the actuator 22 to move the pusher 21 toward the fixed clamp portions 20b to a predetermined gripping position at which the wafer W as the substrate is gripped (step S10).

The determination part 420 determines whether the distortion amount detected by any of the sensors 23 is equal to or greater than the first threshold (step S11).

When the distortion amount detected by any of the sensors 23 is not equal to nor greater than the first threshold (step S11: No), the determination part 420 determines that the defective gripping in which the wafer W is not gripped has occurred (step S12), and the process ends.

Meanwhile, when the distortion amount detected by any of the sensors 23 is equal to or greater than the first threshold (step S10: Yes), the determination part 420 determines whether the difference in the distortion amounts detected by the sensor 23 is equal to or greater than the second threshold (step S13).

When the difference in the distortion amounts is equal to or greater than the second threshold (step S13: Yes), the determination part 420 determines that the defective gripping in which one of the fixing clamp portions 20b is not engaged with the edge of the wafer W has occurred (step S14), and the process ends.

Meanwhile, when the difference in the distortion amounts is less than the second threshold (step S11: No), the determination part 420 determines that the wafer W is gripped normally (step S15), and the process ends.

As described above, the wafer transfer device 10 according to the present embodiment includes the fork 20 (support part), the pusher 21 (gripping part), the plurality of sensors 23 (detection parts), and the determination part 420. The fork 20 is provided with the plurality of fixed clamp portions 20b (engagement portions) which support the wafer W (substrate) to be transferred and are engaged with the edge of the wafer W on one side of the wafer W. The pusher 21 is provided with the plurality of movable clamp portions 21b (contact portions) configured to move toward or away from the plurality of fixed clamp portions 20b and to come into contact with the edge of the wafer W on the other side of the wafer W during movement. The sensors 23 are provided in the plurality of movable clamp portions 21b, respectively, and detect the distortions of the movable clamp portions 21b. The determination part 420 determines the gripping state of the wafer W based on the results detected by the plurality of sensors 23. As a result, the wafer transfer device 10 is capable of detecting the defective gripping of the wafer W.

In addition, the determination part 420 determines the gripping state of the wafer W based on the waveforms of the distortion amounts detected by the plurality of sensors 23. As a result, the wafer transfer device 10 is capable of distinguishably detecting the defective gripping in which the wafer W is not gripped and the defective gripping corresponding to the state in which one of the fixed clamp portions 20b is not engaged with the edge of the wafer W.

In addition, the determination part 420 determines whether or not the defective gripping has occurred based on the difference in the distortion amounts detected by the plurality of sensors 23. In addition, when the distortion amount detected by any of the sensors 23 is equal to or greater than the first threshold and the difference in the distortion amounts detected by the plurality of sensors 23 is equal to or greater than the second threshold, the determination part 420 determines that the defective gripping has occurred. As a result, the wafer transfer device 10 is capable of detecting the defective gripping of the wafer W, which corresponds to the state in which the fixed clamp portions 20b are not engaged with the edge of the wafer W.

The fork 20 has the bifurcated tip ends, and the fixed clamp portion 20b is provided at each of the bifurcated tip ends. The pusher 21 includes the two movable clamp portions 21b provided at an interval. As a result, the wafer transfer device 10 comes into contact with the wafer W at four locations, thus gripping the wafer W in a stable manner.

In addition, the wafer transfer device 10 according to the present embodiment includes the storage part 410. The storage part 410 stores the waveform data of the distortion amount when the wafer W is normally transferred. The determination part 420 further determines whether or not the transfer abnormality has occurred by comparing the waveforms of the distortion amounts detected by the plurality of sensors 23 during the transfer of the wafer W with the waveform of the waveform data stored in the storage part 410. As a result, the wafer transfer device 10 is capable of detecting the occurrence of the transfer abnormality such as an erroneous contact between the wafer W and the wafer transfer device 10 during the transfer of the wafer W.

In addition, the determination part 420 determines whether the surrounding devices have deteriorated based on the change in the distortion amounts detected by the sensor 23 in the state in which the operation of the wafer transfer device 10 is stopped. As a result, the wafer transfer device 10 is capable of detecting deterioration of the surrounding devices. In addition, the wafer transfer device 10 is capable of detecting vibration generated in the wafer transfer device 10 based on the waveforms of the distortion amounts detected by the sensor 23 during the stop of the operation of the wafer transfer device 10. Even if the operation of the wafer transfer device 10 is stopped, when there is a deterioration such as loosening of screws, or an abnormality of a drive component such as a gear or a belt, the wafer transfer device 10 vibrates. Therefore, the wafer transfer device 10 is capable of detecting deterioration of the wafer transfer device 10 itself based on the presence or absence of the vibration. Furthermore, even while the wafer transfer device 10 is operating, it is possible to determine whether or not the vibration applied to the gripped wafer W increases by comparing the waveforms of the distortion amounts detected by the sensor 23 with the waveform of the waveform data stored in the storage part 410. The wafer transfer device 10 is capable of estimating a degree of soundness of the operation of transferring the wafer W based on a magnitude of the increase in vibration during the operation.

Although embodiments have been described above, it should be noted that the embodiments described herein are exemplary in all respects and are not restrictive. Indeed, the embodiments described herein may be embodied in a variety of other forms. The above-described embodiments may be omitted, replaced or modified in various forms without departing from the scope and spirit of the appended claims.

For example, in the above embodiments, the case in which the substrate is the wafer W has been described as an example, but the present disclosure is not limited thereto. The substrate may be any substrate such as a glass substrate.

According to the present disclosure, it is possible to detect a defective gripping of a substrate.

What is claimed is:

1. A substrate transfer device comprising:
a support part configured to support a substrate to be transferred and provided with a plurality of engagement portions which are engaged with an edge of the substrate on a first side of the substrate;
a gripping part configured to move toward or away from the plurality of engagement portions and provided with a plurality of contact portions which come into contact with the edge of the substrate on a second side of the substrate when moving toward the plurality of engagement portions;
at least one of a plurality of detection parts provided in each of the plurality of contact portions, respectively, the plurality of detection parts being configured to detect distortion amounts of the plurality of contact portions; and
a determination part configured to determine a gripping situation of the substrate based on a degree of the distortion amounts obtained by the plurality of detection parts,
wherein when the distortion amount detected by one of the plurality of detection parts is equal to or greater than a first threshold and a difference in the distortion amounts detected by the plurality of detection parts is equal to or greater than a second threshold, the determination part determines that a defective gripping has occurred.

2. The substrate transfer device of claim 1, wherein the determination part determines the gripping situation of the substrate based on waveforms of the distortion amounts detected by the plurality of detection parts.

3. The substrate transfer device of claim 2, wherein the support part is a fork having bifurcated tip ends, and the plurality of engagement portions are provided in the bifurcated tip ends, respectively, and
the plurality of contact portions of the gripping part are two contact portions provided at an interval.

4. The substrate transfer device of claim 1, further comprising:
a storage part storing waveform data of the distortion amounts when the substrate is transferred normally,
wherein the determination part determines whether a transfer abnormality has occurred by comparing waveforms of the distortion amounts detected by the plurality of detection parts when the substrate is transferred with a waveform of the waveform data stored in the storage part.

5. The substrate transfer device of claim 1, wherein the determination part determines whether a surrounding device has deteriorated based on a change in the distortion amounts detected by the plurality of detection parts in a state in which an operation of the substrate transfer device is stopped.

6. The substrate transfer device of claim 1, wherein the support part is a fork having bifurcated tip ends, and the plurality of engagement portions are provided in the bifurcated tip ends, respectively, and
the plurality of contact portions of the gripping part are two contact portions provided at an interval.

7. A method of determining a gripping of a substrate in a substrate transfer device,
wherein the substrate transfer device includes: a support part configured to support a substrate to be transferred and provided with a plurality of engagement portions which are engaged with an edge of the substrate on a first side of the substrate; a gripping part configured to move toward or away from the plurality of engagement portions and provided with a plurality of contact portions which come into contact with the edge of the substrate on a second side of the substrate when moving toward the plurality of engagement portions; at least one of a plurality of detection parts provided in each of the plurality of contact portions, respectively, the plurality of detection parts being configured to detect distortion amounts of the plurality of contact portions,
the method comprising:
determining a state of the gripping of the substrate based on a degree of the distortion amounts obtained by the plurality of detection parts when the substrate is gripped by the plurality of engagement portions and the plurality of contact portions,
wherein the determining the state of the gripping of the substrate includes, when the distortion amount detected by one of the plurality of detection parts is equal to or greater than a first threshold and a difference in the distortion amounts detected by the plurality of detection parts is equal to or greater than a second threshold, determining that a defective gripping has occurred.

* * * * *